US012604777B2

(12) United States Patent
Nomaguchi et al.

(10) Patent No.: US 12,604,777 B2
(45) Date of Patent: Apr. 14, 2026

(54) SEMICONDUCTOR MODULE

(71) Applicant: FUJI ELECTRIC CO., LTD.,
Kawasaki (JP)

(72) Inventors: Ryo Nomaguchi, Matsumoto-city (JP);
Takahito Harada, Matsumoto-city (JP)

(73) Assignee: FUJI ELECTRIC CO., LTD.,
Kanagawa (JP)

( * ) Notice: Subject to any disclaimer, the term of this
patent is extended or adjusted under 35
U.S.C. 154(b) by 484 days.

(21) Appl. No.: 18/158,430

(22) Filed: Jan. 23, 2023

(65) Prior Publication Data

US 2023/0282632 A1 Sep. 7, 2023

(30) Foreign Application Priority Data

Mar. 4, 2022 (JP) ................................. 2022-033897

(51) Int. Cl.
*H01L 25/18* (2023.01)
*H01L 23/00* (2006.01)
*H05K 1/02* (2006.01)
(52) U.S. Cl.
CPC .............. *H01L 25/18* (2013.01); *H01L 24/48*
(2013.01); *H01L 24/49* (2013.01); *H05K*
*1/0296* (2013.01); *H01L 2224/48137*
(2013.01); *H01L 2224/48227* (2013.01); *H01L*
*2224/49175* (2013.01); *H01L 2924/1203*
(2013.01); *H01L 2924/13055* (2013.01); *H01L*
*2924/13091* (2013.01); *H05K 2201/10166*
(2013.01); *H05K 2201/10174* (2013.01)
(58) Field of Classification Search
None
See application file for complete search history.

(56) References Cited

U.S. PATENT DOCUMENTS 6,304,472 B1 10/2001 Nagasu
2002/0047132 A1* 4/2002 Fukada ............... H01L 23/5386
257/114

(Continued)

FOREIGN PATENT DOCUMENTS

JP 2000324846 A 11/2000
JP 2017108187 A 6/2017

(Continued)

OTHER PUBLICATIONS

Office Action issued for counterpart Japanese Application No.
2022-033897, transmitted from the Japanese Patent Office on Feb.
17, 2026.

*Primary Examiner* — Sue A Purvis
*Assistant Examiner* — Jordan M Klein

(57) ABSTRACT

A semiconductor module, including a first main wiring line
connecting portion and a second main wiring line connect-
ing portion, and a main output wiring line connecting
portion is provided. The circuit board includes a circuit
region in which the first circuit and the second circuit are
arranged alongside each other in the first direction, and a
first connecting region and a second connecting region
arranged sandwiching the circuit region in a second direc-
tion orthogonal to the first direction. The first main wiring
line connecting portion and the second main wiring line
connecting portion are provided in the first connecting
region, and the main output wiring line connecting portion
is provided in the second connecting region.

23 Claims, 5 Drawing Sheets

(56)  References Cited

U.S. PATENT DOCUMENTS

2015/0115288  A1      4/2015  Tamada
2020/0118965  A1*    4/2020  Enomoto  ............ H01L 23/3735
2020/0185359  A1      6/2020  Nakashima
2020/0388605  A1*  12/2020  Esch  ....................... H01L 25/18

FOREIGN PATENT DOCUMENTS

WO          2015136603  A1      9/2015
WO          2019044748  A1      3/2019

* cited by examiner

SEMICONDUCTOR MODULE

BACKGROUND

1. Technical Field

The present invention relates to a semiconductor module.

2. Related Art

Conventionally, a semiconductor module including a plurality of semiconductor devices has been known (for example, refer to Patent Document 1).

Patent Document 1: International Publication No. WO 2019/044748

Patent Document 2: International Publication No. WO 2015/136603

Patent Document 3: Japanese Patent Application Publication No. 2000-324846

DESCRIPTION OF EXEMPLARY EMBODIMENTS

Hereinafter, the invention will be described through embodiments of the invention, but the following embodiments do not limit the present invention according to claims. In addition, not all of the combinations of features described in the embodiments are essential for a solving means of the invention.

As used herein, an "upper" side refers to one side in a direction parallel to a depth direction of a semiconductor substrate included in a semiconductor device, and a "lower" side refers to the other side. One of two main surfaces of a substrate, a layer, or another member may be referred to as an upper surface, and the other may be referred to as a lower surface. The "upper" and "lower" directions are not limited to directions parallel to a gravity direction.

As used herein, technical matters may be described with orthogonal coordinate axes consisting of an X axis, a Y axis, and a Z axis. As used herein, a XY plane is parallel to an upper surface of the semiconductor device, and a Z axis is perpendicular to the XY plane.

As used herein, a distance, a resistance value, a current, and a magnitude of another parameter etc. may be explained with such a phrase "equal" or "same". When these are explained as being "equal" or the "same", these are not limited to be equal to each other completely, but may be different from each other without deviating from the scope of the invention described herein. For example, being "equal" or the "same" may include an error of 10% or less.

Figure 1:
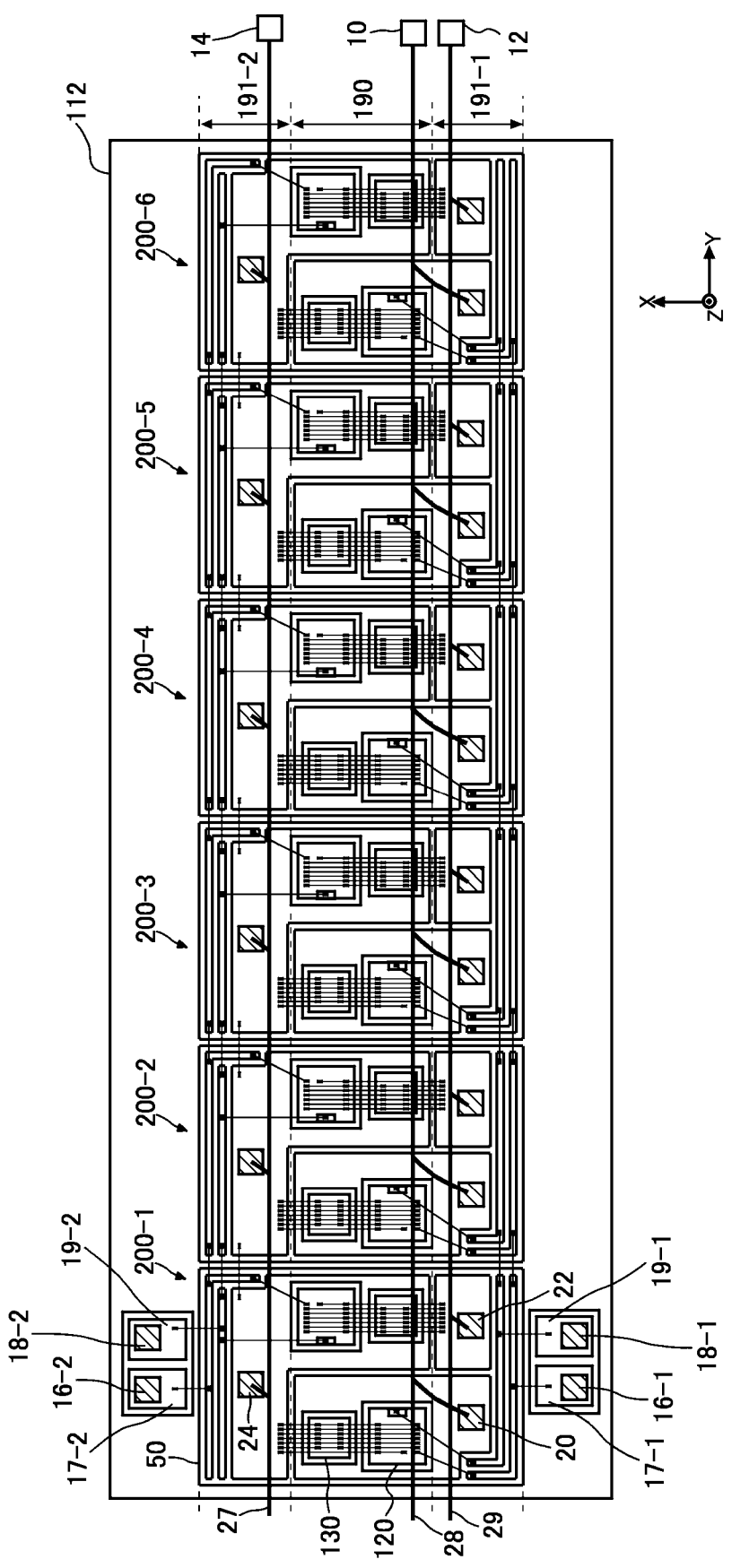
FIG. 1 is one example of an internal circuit accommodated inside a semiconductor module 100.

FIG. 1 is one example of an internal circuit accommodated inside a semiconductor module 100. FIG. 1 illustrates an example of an arrangement of the internal circuit provided on a base portion 112. The internal circuit of the present example is an inverter circuit, whereas the internal circuit is not limited to be this. The semiconductor module 100 may include a case made of resin or the like for covering the internal circuit, and a plurality of terminals exposed from the case. The plurality of terminals is configured to connect the internal circuit to an external circuit. FIG. 1 illustrates control terminals 18 and auxiliary emitter terminals 16 among the plurality of terminals.

Each auxiliary emitter terminal 16 is configured to supply an emitter voltage in an emitter electrode of a transistor device 120 included in the semiconductor module 100. The transistor device is an IGBT by way of example, but can also be a MOSFET. When the transistor device is the MOSFET, an "emitter" can be read as being a "source", and a "collector" can be read as being a "drain" in the present specification.

Each control terminal 18 is configured to supply a control terminal of the transistor device 120 with a control voltage. The control voltage is a gate voltage in the IGBT or the MOSFET, by way of example.

The semiconductor module 100 is for accommodating the internal circuit including the transistor device 120 and a diode device 130. The internal circuit is an inverter for example, but is not limited thereto. In one example, the semiconductor module 100 is used for a power conditioner (PCS: Power Conditioning Subsystem).

The base portion 112 is a board-shaped base material. The base portion 112 may be formed of a conductive material such as aluminum. The base portion 112 may be applied with a ground electric potential. A cooling device such as a fin may be fixed on a lower surface of the base portion 112. An insulative circuit board may be provided on an upper surface of the base portion 112. A circuit including the semiconductor device and a wiring line is formed on the circuit board. The case is fixed on the upper surface of the base portion 112 with an adhesive material etc. As seen in a top view from a Z axis direction, the base portion 112 may have two pairs of two sides facing each other. The base portion 112 of the present example has a long side along a Y axis, and a short side along an X axis.

The base portion 112 is provided with auxiliary emitter patterns 17 connected to the auxiliary emitter terminals 16. An auxiliary emitter pattern 17 may be provided for each auxiliary emitter terminal 16. Each auxiliary emitter pattern 17 is a wiring pattern made of a copper plate or the like that is formed on an insulating substrate mounted on the base portion 112, for example. Positions where the auxiliary emitter terminals 16 are connected in the auxiliary emitter patterns 17 are hatched with diagonal lines. The auxiliary emitter pattern 17 is connected to the emitter electrode of the transistor device 120 through a wiring pattern, a wire, a lead frame, or the like. In FIG. 1, the wire is shown with a thin straight line.

The base portion 112 is provided with control patterns 19 connected to the control terminals 18. A control pattern 19 may be provided for each control terminal 18. Each control pattern 19 is a wiring pattern made of a copper plate or the like that is formed on the insulating substrate mounted on the base portion 112, for example. Positions where the control terminals 18 are connected in the control patterns 19 are hatched with diagonal lines. The control pattern 19 is connected to the control terminal of the transistor device 120 through a wiring pattern, a wire, a lead frame, or the like.

A plurality of circuit blocks 200 is provided on the base portion 112. In the example shown in FIG. 1, six circuit blocks 200, i.e., 200-1 to 200-6 are provided. Each of the circuit blocks 200 may be electrically connected with each other in parallel. In the present example, the plurality of circuit blocks 200 is aligned along a first direction. In another example, the plurality of circuit blocks 200 may be arranged alongside each other in a plurality of lines. In a top view of the base portion 112, the first direction may be parallel to any side of the base portion 112, for example. In the example shown in FIG. 1, the first direction is parallel to the long side of the base portion 112, i.e., a Y axis direction. In a plane parallel to the upper surface of the base portion 112, i.e., the XY plane, a direction perpendicular to the first direction is referred to as a second direction. In the example shown in FIG. 1, the second direction is parallel to the short side of the base portion 112, i.e., an X axis direction. Note that, the directions for the first direction and the second direction are not limited to those described above. The second direction can be parallel to the long side of the base portion 112, the first direction can be parallel to the short side of the base portion 112, or the first direction and the second direction may not be parallel to the sides of the base portion 112.

In the example shown in FIG. 1, a reference numeral has been attached for each component of the circuit block 200-1, while other circuit blocks 200 have the same structure as that of the circuit block 200-1. The circuit block 200 of the present example includes a circuit board 50, one or more transistor devices 120, one or more diode devices 130, a first main wiring line connecting portion 20, a second main wiring line connecting portion 22, and a main output wiring line connecting portion 24.

The circuit board 50 is a substrate arranged on the base portion 112. The circuit board 50 may include an insulating substrate formed with an insulating material such as ceramic. The circuit board 50 may have conductive patterns on front and back surfaces of the insulating substrate. These patterns may function as wiring patterns for the circuit block 200. For example, the circuit board 50 is a DCB (Direct Copper Bonding) substrate formed by directly bonding a copper circuit board on a ceramic substrate.

The transistor device 120 and the diode device 130 are provided on the circuit board 50. The transistor device 120 is an IGBT or a MOSFET, for example. The diode device 130 is a freewheeling diode (FWD) connected inversely in parallel with the transistor device 120, for example. In the example shown in FIG. 1, the transistor device 120 and the diode device 130 are semiconductor chips different from each other, whereas in another example, the transistor device 120 and the diode device 130 can be formed on a same semiconductor chip. In that case, there may be no chip for the diode device 130 but a chip for the transistor device 120 illustrated in each diagram. For example, the transistor device 120 and the diode device 130 can be RC-IGBTs (Reverse Conducting IGBTs). Alternatively, the diode device 130 can be a built-in diode for a MOSFET. The transistor device 120 and the diode device 130 of the present example are vertical devices of which main electrodes (e.g., an emitter electrode and a collector electrode) are separately formed on the upper surface and the lower surface of the semiconductor substrate, and in which a main current flows in a depth direction of the semiconductor substrate. In another example, the transistor device 120 and the diode device 130 can be horizontal devices of which two main electrodes are formed on a same surface.

The first main wiring line connecting portion 20 is a region on a wiring pattern of the circuit board 50. The first main wiring line connecting portion 20 is electrically connected to a first power source terminal 10, and applied with a first power source voltage. The first power source terminal 10 is connected to a positive side terminal of a DC power source that is externally provided to the semiconductor module 100. The semiconductor module 100 may include a first main wiring line 28 for connecting the first main wiring line connecting portion 20 to the first power source terminal 10. The first main wiring line 28 may connect the first main wiring line connecting portion 20 of each circuit block 200 to the first power source terminal 10. FIG. 1 schematically illustrates the first main wiring line 28 and the first power source terminal 10. The first main wiring line connecting portion 20 is connected to the transistor device 120 and the diode device 130 through a wiring pattern, a wire, a lead frame, or the like on the circuit board 50.

The second main wiring line connecting portion 22 is a region on the wiring pattern of the circuit board 50. The second main wiring line connecting portion 22 is electrically connected to a second power source terminal 12, and applied with a second power source voltage. The second power source terminal 12 is connected to a negative side terminal of the external DC power source. The first power source terminal 10 and the second power source terminal 12 are configured to function as power source terminals (P, N) in a circuit accommodated by the semiconductor module 100. In the present example, the first power source voltage is higher than the second power source voltage, whereas the second power source voltage can be higher than the first power source voltage. The semiconductor module 100 may include a second main wiring line 29 for connecting the second main wiring line connecting portion 22 to the second power source terminal 12. The second main wiring line 29 may connect the second main wiring line connecting portion 22 of each circuit block 200 to the second power source terminal 12. FIG. 1 schematically illustrates the second main wiring line 29 and the second power source terminal 12. The second main wiring line connecting portion 22 is connected to the transistor device 120 and the diode device 130 through a wiring pattern, a wire, a lead frame, or the like on the circuit board 50.

The main output wiring line connecting portion 24 is a region on a wiring pattern of the circuit board 50. The main output wiring line connecting portion 24 is electrically connected to an output terminal 14, and configured to output an output voltage of the circuit block 200 to the output terminal 14. The output terminal 14 is configured to function as an output terminal (U) of a circuit accommodated in the semiconductor module 100. The semiconductor module 100 may include a main output wiring line 27 for connecting the main output wiring line connecting portion 24 to the output terminal 14. The main output wiring line 27 may connect the main output wiring line connecting portion 24 of each circuit block 200 to the output terminal 14. FIG. 1 schematically illustrates the main output wiring line 27 and the output terminal 14. The main output wiring line connecting portion 24 is connected to the transistor device 120 and the diode device 130 through a wiring pattern a wire, a lead frame, or the like on the circuit board 50. With such structure, the circuit block 200 is electrically connected to each external terminal.

In the present example, a circuit region 190 refers to a region provided with the transistor device 120 and the diode device 130 on the upper surface of the base portion 112 (i.e., the XY plane). The circuit region 190 may be a rectangular region with a minimum area including all of the transistor devices 120 and the diode devices 130 on the XY plane. The circuit region 190 may be the rectangular region with sides parallel to each side of the base portion 112. The circuit region 190 may be the rectangular region with sides parallel to the first direction (the Y axis direction in the present example) and the second direction (the X axis direction). Positions of two ends of the circuit region 190 in the second direction are positions of edges of either the transistor device 120 or the diode device 130 arranged on an outermost side in the second direction.

A first connecting region 191-1 and a second connecting region 191-2 refer to regions in each circuit block 200 which sandwich the circuit region 190 in the second direction, i.e., the X axis direction. In the present example, the first connecting region 191-1 is arranged on a negative side of the X axis direction from the circuit region 190, and the second connecting region 191-2 is arranged on a positive side of the X axis direction from the circuit region 190. Note that, the positive side of the X axis direction refers to a side pointed by an arrow of the X axis illustrated in FIG. 1, and the negative side in the X axis direction refers to a side opposite to the side pointed by the arrow of the X axis.

The first main wiring line connecting portion 20 and the second main wiring line connecting portion 22 of each circuit block 200 are provided in the first connecting region 191-1. The main output wiring line connecting portion 24 is provided in the second connecting region 191-2. With such an arrangement, connecting portions on an input side (first main wiring line connecting portions 20 and second main wiring line connecting portions 22) can be collectively arranged on a same side, and connecting portions on an output side (main output wiring line connecting portions 24) can be collectively arranged on a same side. Therefore, a main wiring line for connecting each connecting portion to each terminal can be easily arranged.

Figure 2:
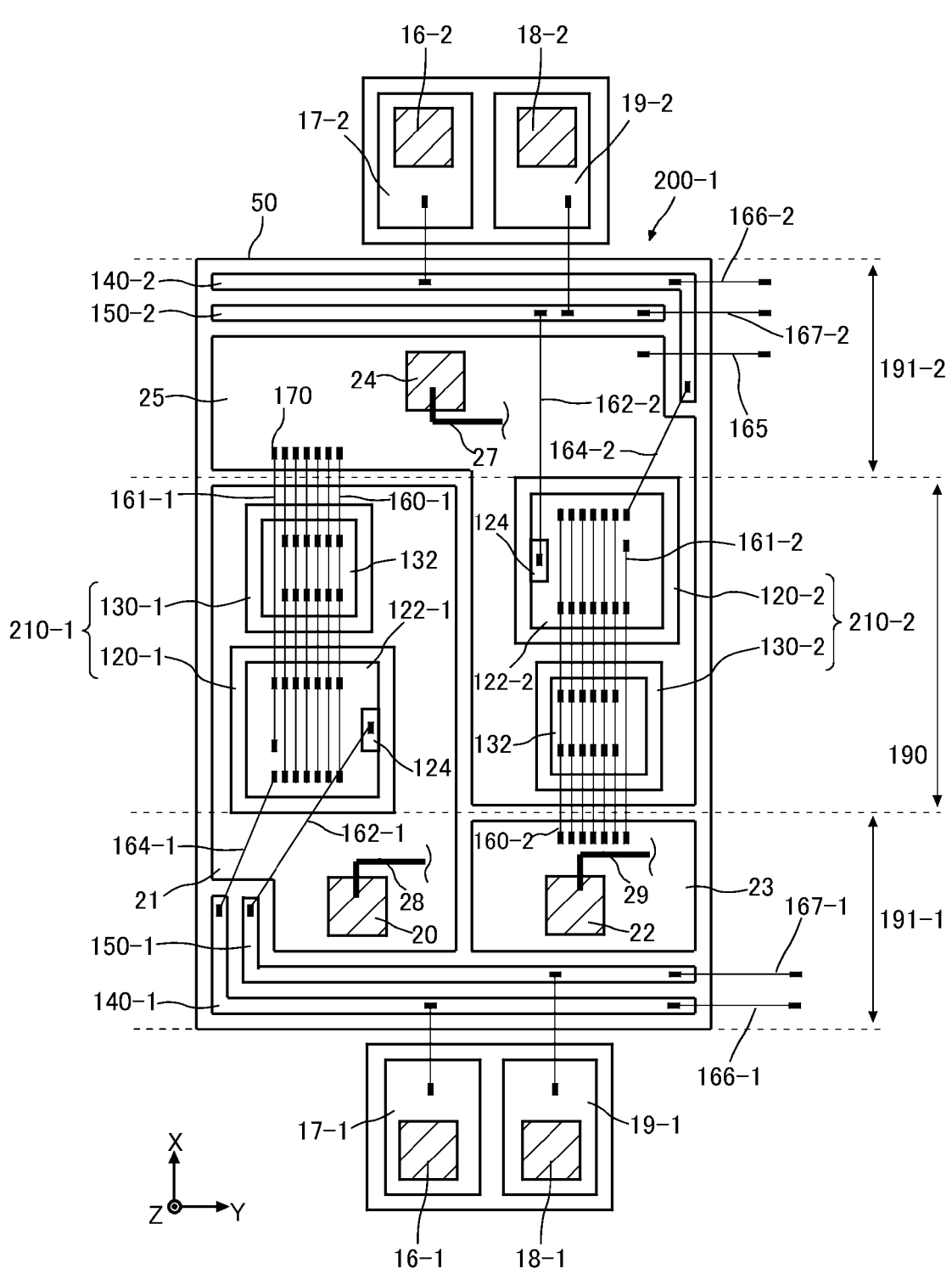
FIG. 2 illustrates structure of a circuit block 200 in detail.

FIG. 2 illustrates structure of the circuit block 200 in detail. While the structure of the circuit block 200-1 is illustrated in FIG. 2, other circuit blocks 200 have structure a same as that of the circuit block 200-1. The circuit block 200 of the present example includes the circuit board 50, a first circuit 210-1, a second circuit 210-2, and a wiring pattern. The wiring pattern is a pattern made of a copper plate, a copper foil, or the like provided on the circuit board 50. The wiring pattern of the present example includes a first main wiring pattern 21, a second main wiring pattern 23, a main output wiring pattern 25, a first auxiliary emitter wiring line 140-1, a second auxiliary emitter wiring line 140-2, a first control wiring line 150-1, and a second control wiring line 150-2.

In addition, the circuit block 200 may include a plurality of wires 160 to 167 for connecting between devices or wiring lines. In FIG. 2, the wires are illustrated with thin straight lines, and connection points for the wires and other members are illustrated with rectangles. A part or all of the wires in the structure shown in FIG. 2 etc. may be replaced by wiring lines such as lead frames. The transistor devices 120 and the diode devices 130 of the present example include main electrodes on their upper surfaces and lower surfaces. Each of the transistor devices 120 and the diode devices 130 are provided on any wiring pattern, and the main electrode provided on the lower surface of the each of these devices is connected to this wiring pattern. On the other hand, the main electrode provided on the upper surface of the each of these devices is connected to another member with a wire etc.

The first main wiring pattern 21 includes the first main wiring line connecting portion 20. The second main wiring pattern 23 includes the second main wiring line connecting portion 22. The main output wiring pattern 25 includes the main output wiring line connecting portion 24. Each of these connecting portions may be included in a region of its own wiring pattern, and may be a member such as a pad or a copper block provided on this wiring pattern.

The first main wiring line connecting portion 20 is connected to the first main wiring line 28. The first main wiring line 28 is configured to connect the first main wiring line connecting portion 20 to the first power source terminal 10. The first main wiring line 28 is a metallic member in a board-shape or a rod-shape, for example. FIG. 2 schematically illustrates the first main wiring line 28 with a bent line. The first main wiring line 28 may be connected to the plurality of first main wiring line connecting portions 20 in the plurality of circuit blocks 200.

The second main wiring line connecting portion 22 is connected to the second main wiring line 29. The second main wiring line 29 is configured to connect the second main wiring line connecting portion 22 to the second power source terminal 12. The second main wiring line 29 is a metallic member in a board-shape or a rod-shape, for example. FIG. 2 schematically illustrates the second main wiring line 29 with a bent line. The second main wiring line 29 may be connected to the plurality of second main wiring line connecting portions 22 in the plurality of circuit blocks 200.

The main output wiring line connecting portion 24 is connected to the main output wiring line 27. The main output wiring line 27 is configured to connect the main output wiring line connecting portion 24 to the output terminal 14. The main output wiring line 27 is a metallic member in a board-shape or a rod-shape, for example. FIG. 2 schematically illustrates the main output wiring line 27 with a bent line. The main output wiring line 27 may be connected to the plurality of main output wiring line connecting portions 24 in the plurality of circuit blocks 200.

The first auxiliary emitter wiring line 140-1 is connected to a first auxiliary emitter pattern 17-1 through a wire etc. The first auxiliary emitter wiring line 140-1 is configured to prescribe an electric potential of a main electrode 122 of a first transistor device 120-1 depending on a voltage of a first auxiliary emitter terminal 16-1. The second auxiliary emitter wiring line 140-2 is connected to a second auxiliary emitter pattern 17-2 through a wire etc. The second auxiliary emitter wiring line 140-2 is configured to prescribe an electric potential of a main electrode 122 of a second transistor device 120-2 depending on a voltage of a second auxiliary emitter terminal 16-2. The first control wiring line 150-1 is connected to a first control pattern 19-1 through a wire etc. The second control wiring line 150-2 is connected to a second control pattern 19-2 through a wire etc. In two circuit blocks 200 arranged adjacent to each other, their auxiliary emitter wiring lines 140 may be connected to one another by a block-to-block wire 166, and their control wiring lines 150 may be connected to one another by a block-to-block wire 167. In this manner, in the plurality of circuit blocks 200, auxiliary emitter wiring lines 140 are connected to the auxiliary emitter terminal 16, and control wiring lines 150 are connected to the control terminal 18. In addition, in two circuit blocks 200 arranged adjacent to each other, their main output wiring patterns 25 may be connected to one another by a block-to-block wire 165.

The first circuit 210-1 is electrically connected between the first main wiring line connecting portion 20 and the main output wiring line connecting portion 24. The first circuit 210-1 of the present example includes a first transistor device 120-1 and a first diode device 130-1 connected inversely in parallel to each other. The phrase "connected inversely in parallel" refers to a condition in which the emitter electrode of the transistor device 120 being connected to an anode electrode of the diode device 130, and the collector electrode of the transistor device 120 being connected to a cathode electrode of the diode device 130.

A first main electrode 122-1 and a control electrode 124 are provided on an upper surface of the first transistor device 120-1. A second main electrode 122-2 and a control electrode 124 are provided on an upper surface of a second transistor device 120-2. A diode electrode 132 is provided on an upper surface of each diode device 130. For example, the main electrode 122 is an emitter electrode, the control electrode 124 is a gate electrode, and the diode electrode 132 is an anode electrode.

The first transistor device 120-1 and the first diode device 130-1 are arranged on the first main wiring pattern 21. The first main wiring pattern 21 may be provided in the first connecting region 191-1 and the circuit region 190. Electrodes such as a collector electrode and a cathode electrode on lower surfaces of the first transistor device 120-1 and the first diode device 130-1 are connected to the first main wiring pattern 21 by soldering etc. The first main electrode 122-1 of the first transistor device 120-1 and the diode electrode 132 of the first diode device 130-1 are connected to the main output wiring pattern 25 through a first main wiring wire 160-1. Each wire includes a connecting portion 170 to be connected to another member. In FIG. 2, the connecting portion 170 of the each wire is shown with a rectangle, but a reference numeral has been omitted for some connecting portions 170. The first circuit 210-1 may include a first main wiring wire 161-1 for directly connecting the first main electrode 122-1 to the main output wiring pattern 25 without using the diode electrode 132.

The control electrode 124 of the first transistor device 120-1 is connected to the first control wiring line 150-1 by a first control wire 162-1. This causes the control electrode 124 to be applied with a gate voltage. The first main electrode 122-1 of the first transistor device 120-1 is connected to the first auxiliary emitter wiring line 140-1 through a first auxiliary wire 164-1. This causes an electric potential of the first main electrode 122-1 to be controlled by a voltage of a first auxiliary emitter terminal 16-1, or to be detected by the first auxiliary emitter terminal 16-1.

The second circuit 210-2 is electrically connected between the main output wiring line connecting portion 24 and the second main wiring line connecting portion 22. The second circuit 210-2 of the present example includes the second transistor device 120-2 and a second diode device 130-2 connected inversely in parallel to each other.

The second transistor device 120-2 and the second diode device 130-2 are arranged on the main output wiring pattern 25. The main output wiring pattern 25 may be provided in the second connecting region 191-2 and the circuit region 190. Electrodes such as a collector electrode and a cathode electrode on lower surfaces of the second transistor device 120-2 and the second diode device 130-2 are connected to the main output wiring pattern 25 by soldering etc. The second main electrode 122-2 of the second transistor device 120-2 and a diode electrode 132 of the second diode device 130-2 are connected to the second main wiring pattern 23 through a second main wiring wire 160-2. The second circuit 210-2 may include a second main wiring wire 161-2 for directly connecting the second main electrode 122-2 to the second main wiring pattern 23 without using the diode electrode 132. The second main wiring pattern 23 is provided in the first connecting region 191-1. The second main wiring pattern 23 can be provided in the circuit region 190, but this is not necessary.

A control electrode 124 of the second transistor device 120-2 is connected to the second control wiring line 150-2 by a second control wire 162-2. This causes the control electrode 124 to be applied with a gate voltage. The second main electrode 122-2 of the second transistor device 120-2 is connected to the second auxiliary emitter wiring line 140-2 through a second auxiliary wire 164-2. This causes an electric potential of the second main electrode 122-2 to be controlled by a voltage of a second auxiliary emitter terminal 16-2, or to be detected by the second auxiliary emitter terminal 16-2.

The first circuit 210-1 and the second circuit 210-2 are arranged alongside each other in the first direction. The phrase "alongside each other in the first direction" is not used for limiting a position of the first circuit 210-1 in the second direction to completely match a position of the second circuit 210-2 in the second direction. It can be determined as being arranged alongside each other in the first direction, as long as at least a part of a region in the first circuit 210-1 and at least a part of a region in the second circuit 210-2 are facing each other in the first direction. More than half the portion of the first circuit 210-1 in the second direction and the second circuit 210-2 can face each other in the first direction.

As explained with FIG. 1, providing the connecting portions on the input side (i.e., the first main wiring line connecting portion 20 and the second main wiring line connecting portion 22) in the first connecting region 191-1, and providing the connecting portion on the output side (i.e., the main output wiring line connecting portion 24) in the second connecting region 191-2 allow the main wiring lines (i.e., the first main wiring line 28, the second main wiring line 29, and the main output wiring line 27) for connecting the plurality of connecting portions to each terminal to be easily arranged inside the semiconductor module 100. In addition, because the main output wiring line 27 can be arranged apart from the first main wiring line 28 and the second main wiring line 29, an induction component and a capacity component between the main output wiring line 27, and the first main wiring line 28 and the second main wiring line 29 can be reduced. Therefore, influence of noise from an external power supply and the like on the main output wiring line 27 can be reduced.

It is preferable that the first auxiliary wire 164-1 is configured to directly connect the first auxiliary emitter wiring line 140-1 to the first main electrode 122-1. In other words, the first auxiliary wire 164-1 is not connected to a member other than the first auxiliary emitter wiring line 140-1 and the first main electrode 122-1. However, the first auxiliary wire 164-1 can be connected to the diode electrode 132 of the first diode device 130-1. Moreover, the first main wiring wires 160-1 and 161-1 are not connected to the first auxiliary emitter wiring line 140-1. In this manner, a current path from the first auxiliary emitter terminal 16-1 to the first main electrode 122-1, which is referred to as an auxiliary emitter path, can be separated from a current path from the first main electrode 122-1 to the output terminal 14, which is referred to as a main current path. That is, the auxiliary emitter path and the main current path do not have a path in common.

A large main current flows in the main current path. Therefore, if the auxiliary emitter path and the main current path have a path in common, increase or decrease in the main current affects its voltage to be changed, and this change causes a change in an auxiliary emitter voltage to be applied to the first main electrode 122-1. For example, when a current changing speed of the main current is di/dt, and an inductance inside the path in common is Ls, then a change in the voltage of $\Delta V=-Ls\times di/dt$ is caused in the path in common. Thus, magnitude of a gate voltage for an emitter voltage of the first main electrode 122-1 is changed, and then a period of time for switching the first transistor device 120-1 becomes longer, and as a result, switching loss may be increased.

On the other hand, separating the auxiliary emitter path from the main current path enables no change to be caused to the auxiliary emitter voltage (e.g., 0V) to be applied to the first main electrode 122-1 even when the main current is increased or decreased. Hence, switching loss can be reduced in the first transistor device 120-1.

Similar to the first auxiliary wire 164-1, it is preferable that the second auxiliary wire 164-2 is configured to directly connect the second auxiliary emitter wiring line 140-2 to the second main electrode 122-2. In other words, the second auxiliary wire 164-2 is not connected to a member other than the second auxiliary emitter wiring line 140-2 and the second main electrode 122-2. However, the second auxiliary wire 164-2 can be connected to the diode electrode 132 of the second diode device 130-2. Moreover, the second main wiring wires 160-2 and 161-2 are not connected to the second auxiliary emitter wiring line 140-2. In this manner, an auxiliary emitter path from the second auxiliary emitter terminal 16-2 to the second main electrode 122-2 can be separated from a main current path from the second main electrode 122-2 to the second power source terminal 12. That is, the auxiliary emitter path and the main current path do not have a path in common. Hence, switching loss can be reduced in the second transistor device 120-2.

The first auxiliary emitter wiring line 140-1 and the second auxiliary emitter wiring line 140-2 may be arranged sandwiching the circuit region 190 in the second direction, i.e., the X axis direction. In the present example, the first auxiliary emitter wiring line 140-1 is arranged in the first connecting region 191-1, and the second auxiliary emitter wiring line 140-2 is arranged in the second connecting region 191-2. In this manner, the auxiliary wire 164 can easily be connected to each main electrode 122 of the first transistor device 120-1 and the second transistor device 120-2.

In the second direction (i.e., the X axis direction), the first transistor device 120-1 may be arranged between the first diode device 130-1 and the first auxiliary emitter wiring line 140-1. In this manner, the first transistor device 120-1 can be arranged close to the first auxiliary emitter wiring line 140-1, so that the first auxiliary wire 164-1 can easily be provided. The first auxiliary emitter wiring line 140-1 may have a portion extending along the first direction being the Y axis direction, and a portion extending along the second direction being the X axis direction. The portion of the first auxiliary emitter wiring line 140-1 which extends along the second direction may be connected to the first auxiliary wire 164-1. Note that, the second transistor device 120-2, the second diode device 130-2, and the second auxiliary emitter wiring line 140-2 may constitute similar structure as that constituted by the first transistor device 120-1, the first diode device 130-1, and the first auxiliary emitter wiring line 140-1. For example, in the second direction being the X axis direction, the second transistor device 120-2 may be arranged between the second diode device 130-2 and the second auxiliary emitter wiring line 140-2.

In the present example, the main electrode 122 of the each transistor device 120 is not connected to another by a wire etc. Thus, each wire connected to the main electrode 122 can be provided approximately along the second direction being the X axis direction, which prevents crossing of the wires. Therefore, the wires etc. can be densely mounted on each device. The main electrode of the each transistor device 120 is directly connected to a main wiring pattern by a wire etc. Thus, main currents can be prevented from being concentrated on a particular wire compared to a case in which the main electrodes of the transistor devices 120 are connected to one another and then connecting a main electrode of a particular transistor device 120 to the main wiring pattern.

In addition, the control wire 162 and the auxiliary wire 164 are connected to the each transistor device 120 in the present example. Therefore, in each transistor device 120, a gate voltage Vge for an emitter voltage can be controlled with high precision.

Figure 3:
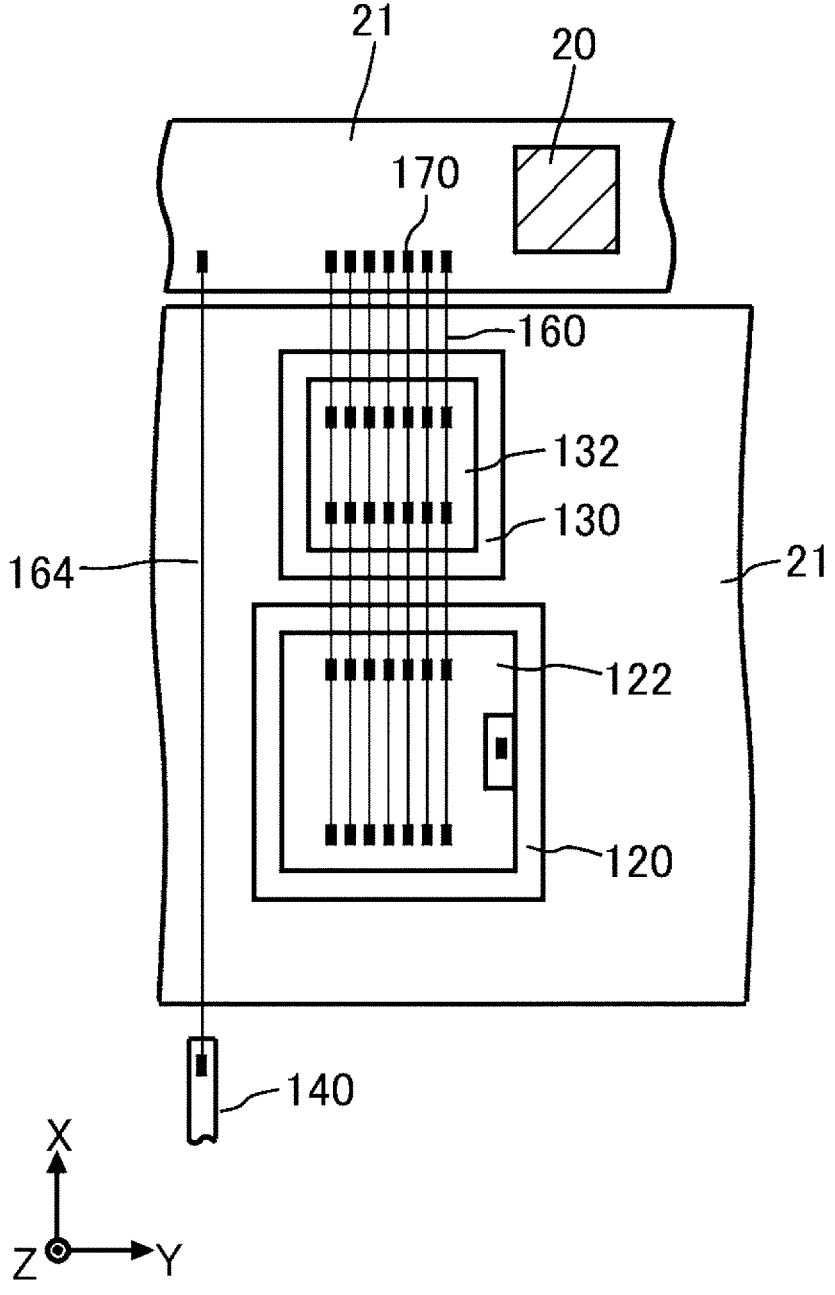
FIG. 3 illustrates an arrangement of an auxiliary wire 164 in a comparative example.

FIG. 3 illustrates an arrangement of an auxiliary wire 164 in a comparative example. The auxiliary wire 164 of the present example is not configured to directly connect a main electrode 122 to an auxiliary emitter wiring line 140. A main electrode 122 of the present example is connected to a first main wiring pattern 21 by a main wiring wire 160. The auxiliary wire 164 is configured to connect a first main wiring pattern 21 to the auxiliary emitter wiring line 140. That is, in a main current path and an auxiliary emitter path, at least the main wiring wire 160 is used as a path in common. In that case, an inductance Ls inside the main wiring wire 160 causes a change in a main current, and then a voltage is changed depending on the change in the main current. Therefore, an emitter voltage of the main electrode 122 is changed, and then a gate voltage Vge for the emitter voltage is changed. As a result, an on-time of the transistor device 120, which is a period of time required for it to be turned on from an off-state, becomes longer and thereby switching loss increases. According to the examples explained with FIGS. 1 and 2, since the main current path and the auxiliary emitter path are separated from each other, an increase in switching loss can be prevented.

Figure 4:
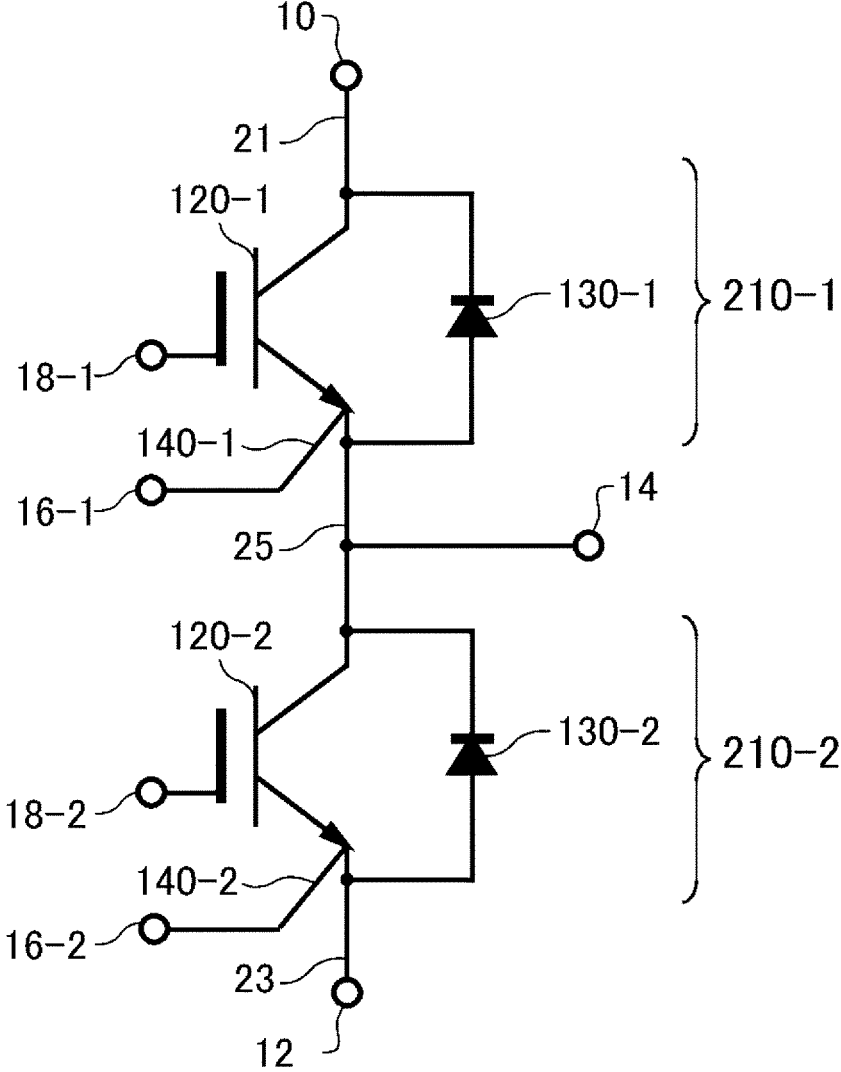
FIG. 4 illustrates one example of a circuit diagram of the circuit block 200.

FIG. 4 illustrates one example of a circuit diagram of a circuit block 200. The circuit block 200 of the present example is an inverter provided between a first power source terminal 10 and a second power source terminal 12. A collector terminal is connected to a first main wiring pattern 21, and an emitter terminal (i.e., a first main electrode 122-1) of the first transistor device 120-1 is connected to a first auxiliary emitter wiring line 140-1 and a main output wiring pattern 25. A first diode device 130-1 is connected inversely in parallel to the first transistor device 120-1.

A collector terminal of a second transistor device 120-2 is connected to the main output wiring pattern 25, and an emitter terminal (i.e., a second main electrode 122-2) of the second transistor device 120-2 is connected to a second auxiliary emitter wiring line 140-2 and a second main wiring pattern 23. The second diode device 130-2 is connected inversely in parallel to the second transistor device 120-2.

The first transistor device 120-1 and the second transistor device 120-2 are complementary to each other in being controlled. That is, they are controlled such that when one of them is in an on-state, the other becomes in an off-state. Note that, a plurality of circuit blocks 200 is provided in parallel to each other between the first power source terminal 10 and the second power source terminal 12. A first transistor device 120-1 of each circuit block 200 may be synchronized with each other in being controlled. That is, a plurality of first transistor devices 120-1 may be controlled such that it is simultaneously turned on, or simultaneously turned off. The second transistor device 120-2 in each circuit block 200 may also be synchronized with each other in being controlled.

As shown in FIG. 1, the semiconductor module 100 may include the plurality of first circuits 210-1 and the plurality of second circuits 210-2. As shown in FIG. 1, the first circuits 210-1 and the second circuits 210-2 may be arranged alternately along the first direction. In the present example, first main electrodes 122-1 of the plurality of first transistor devices 120-1 are not connected to each other. Similarly, second main electrodes 122-2 of the plurality of second transistor devices 120-2 are not connected to each other. Therefore, it is easy to alternately arrange the first circuits 210-1 and the second circuits 210-2 along the first direction. In the present example, the plurality of first transistor devices 120-1 are synchronized with each other in being controlled, and the plurality of second transistor devices 120-2 are synchronized with each other in being controlled. Therefore, alternately arranging the first circuits 210-1 and the second circuits 210-2 permits circuits having on-state transistor devices 120 to be alternately arranged, and thereby thermal distribution can be uniform.

Further, as explained with FIG. 2, the transistor device 120 and the diode device 130 connected inversely in parallel may be arranged on a same wiring pattern. This causes two devices on this wiring pattern to be alternately operated, and thereby the thermal distribution on a XY plane can further be improved.

Figure 5:
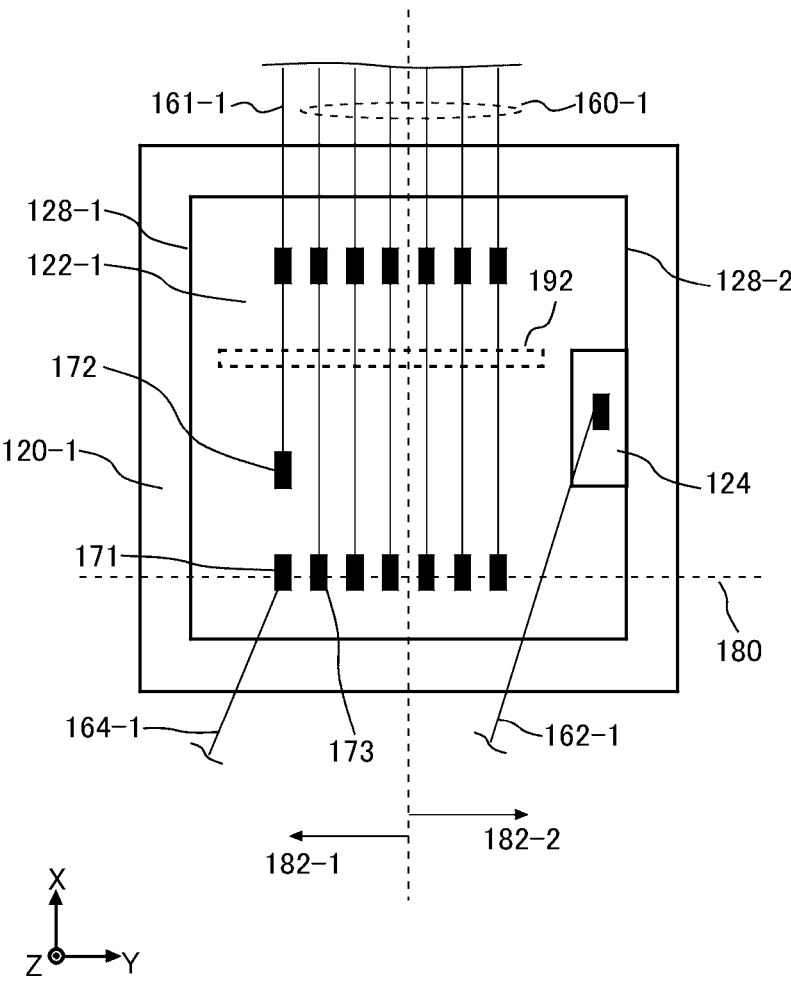
FIG. 5 illustrates an example of an arrangement of a connecting portion of each wire in a main electrode 122.

FIG. 5 illustrates an example of an arrangement of the connecting portion of the each wire in the main electrode 122. Although FIG. 5 illustrates the first main electrode 122-1, the second main electrode 122-2 can also have a same arrangement as that of the first main electrode 122-1.

As explained with FIG. 2, the wire connected to the main electrode 122 includes the main wiring wire 160 and the main wiring wire 161. The main wiring wire 160 is a through-wire for connecting the main electrode 122 to the main wiring pattern such as the main output wiring pattern 25 or the second main wiring pattern 23 via the diode electrode 132. The main wiring wire 161 is a direct-wire for directly connecting the main electrode 122 to the main wiring pattern without using the diode electrode 132.

The main electrode 122 of the transistor device 120 of the present example has an area larger than that of the diode electrode 132 of the diode device 130. In this case, if the transistor device 120 and the main wiring pattern are connected only by the main wiring wires 160, a number of the main wiring wires 160 may be limited due to the area of the diode electrode 132 despite a fact that there is a space for connecting the main wiring wire 160 on the main electrode 122. On the other hand, the number of the main wiring wires to be connected to the main electrode 122 can be increased by providing the main wiring wire 161. This can reduce current that flows in one main wiring wire, and thereby heat generated in the wire can be reduced. A number of the main wiring wires 161 connected to one main electrode 122 may be less than the number of the main wiring wires 160.

A plurality of connecting portions 173 of the main wiring wires 160 for the main electrode 122 may be arranged alongside each other along the first direction. When each main wiring wire 160 includes a plurality of connecting portions for the main electrode 122, the connecting portion 173 is the connecting portion positioned farthest from the main wiring pattern. In other words, the connecting portion 173 is the connecting portion positioned closest to an edge of the main wiring wire 160. In the example shown in FIG. 5, the plurality of connecting portions 173 is arranged on a straight line 180 parallel to the first direction at a predefined interval.

A connecting portion 171 of the auxiliary wire 164 for the main electrode 122 may be arranged farther outward than the plurality of connecting portions 173 of the plurality of main wiring wires 160 in the first direction. The phrase "farther outward" refers to a side closer to an edge of the main electrode 122 in an XY plane. The connecting portion 171 of the auxiliary wire 164 may be arranged on a same straight line 180 on which the plurality of connecting portions 173 are arranged. The connecting portion 171 is arranged on the outermost side on the straight line 180 among the plurality of connecting portions arranged on the straight line 180. A main current that flows into the main electrode 122 may flow in a direction parallel to the XY plane toward the connecting portion 173. Because the main electrode 122 also has a quite small resistance component, a voltage drop may be caused by the main current at the main electrode 122. Therefore, if the connecting portion 171 is sandwiched by the connecting portions 173, the voltage drop caused at the main electrode 122 may affect voltage in the connecting portions 173. In contrast, arranging the connecting portion 171 on the outermost side allows the connecting portion 171 to be arranged in a region where the main current is hard to flow, and thereby influence of the voltage drop at the main electrode 122 on the voltage of the connecting portion 171 can be reduced.

In addition, the connecting portion 171 may be arranged between a connecting portion 172 of the main wiring wire 161 and the auxiliary emitter wiring line 140 (refer to FIG. 2). The connecting portion 172 of the present example may be arranged closer to the main wiring pattern than the straight line 180. With such an arrangement, the connecting portion 171 can also be arranged farther outward in the second direction being the X axis direction, than the connecting portion 172. Therefore, the influence of the voltage drop caused by the main current on the voltage of the connecting portion 171 can be reduced.

As shown in FIG. 5, it is preferable that the connecting portion 171 of the auxiliary wire 164, the connecting portion 173 of the main wiring wire 160, and the connecting portion 172 of the main wiring wire 161 are separated on the main electrode 122. A distance between the connecting portion 171 and the connecting portion 173 may be greater than a distance between two connecting portions 173. Arranging the connecting portion 171 apart from another connecting portion allows the connecting portion 171 to be away from where the main current flows. Therefore, the connecting portion 171 can be prevented from having a temperature rise, being fused, and the like and hence reliability can be improved.

The main electrode 122 and the control electrode 124 of the transistor device 120 are separately provided on its upper surface. The main electrode 122 has a first side 128-1 and a second side 128-2 facing each other in a top view, i.e., the XY plane. The connecting portion 171 of the auxiliary wire 164 may be arranged closer to the first side 128-1 than the second side 128-2. The control electrode 124 may be arranged closer to the second side 128-2 than the first side 128-1.

In the present example, the first side 128-1 and the second side 128-2 are parallel to the second direction, i.e., the X axis direction. A first region 182-1 and a second region 182-2 are regions on the upper surface of the transistor device 120 formed by diving a region of the transistor device 120 in half with a straight line parallel to the second direction. The connecting portion 171 may be arranged in the first region 182-1, and the control electrode 124 may be arranged in the second region 182-2.

In the present example, the auxiliary emitter wiring line 140 to which the auxiliary wire 164 is connected, and the control wiring line 150 to which the control wire 162 is connected are arranged in a same connecting region 191 (refer to FIGS. 1 and 2). Therefore, the auxiliary wire 164 and the control wire 162 approximately extend in a same direction. Arranging the connecting portion 171 and the control electrode 124 apart from each other enables easily providing wiring for the auxiliary wire 164 and the control wire 162.

The transistor device 120 may include a trench gate 192. The trench gate 192 has such structure in which a gate insulating film and a gate electrode are embedded inside a groove formed on an upper surface of the semiconductor substrate. The trench gate 192 is configured to function as gate structure of an IGBT or a MOSFET. When the trench gate 192 is applied with a predefined gate voltage, an N type channel region is formed in a boundary portion in a P type region being in direct contact with the trench gate 192.

The trench gate 192 may be provided extending along the first direction. Although FIG. 5 illustrates one trench gate 192, a plurality of trench gates 192 are provided at predefined interval along the second direction. Since channel regions are formed along the trench gates 192, the channel regions are also provided extending along the first direction. In another example, the trench gates 192 can be provided extending along the second direction. In that case, the plurality of trench gates 192 is arranged at a predefined interval along the first direction.

As shown in FIG. 5, the connecting portion 173 and the connecting portion 171 may be arranged alongside each other in a direction parallel to the extending direction of the trench gate 192. In this manner, the connecting portion 173 and the connecting portion 171 are arranged so as to face a same trench gate 192. Therefore, even if electric potential distribution is generated between a position overlapping with the trench gate 192 and a position not overlapping with the trench gate 192, or even if potential distribution is generated between positions overlapping with different trench gates 192, a difference in electric potentials in the connecting portion 171 and the connecting portion 173 can be reduced. As a result, in a case of detecting an electric potential of the main electrode 122 by using the auxiliary emitter terminal 16, a change in electric potential generated by a main current can be more precisely detected.

While the present invention has been described with the embodiments, the technical scope of the present invention is not limited to the above described embodiments. It is apparent to persons skilled in the art that various alterations and improvements can be added to the above-described embodiments. It is also apparent from the description of the claims that embodiments added with such alterations or improvements can be included in the technical scope of the present invention.

EXPLANATION OF REFERENCES

10: first power source terminal; 12: second power source terminal; 14: output terminal; 16: auxiliary emitter terminal; 17: auxiliary emitter pattern; 18: control terminal: 19: control pattern; 20: first main wiring line connecting portion; 21: first main wiring pattern; 22: second main wiring line connecting portion; 23: second main wiring pattern; 24: main output wiring line connecting portion; 25: main output wiring pattern; 27: main output wiring line; 28: first main wiring line; 29: second main wiring line; 50: circuit board; 100: semiconductor module; 112: base portion; 120: transistor device; 122: main electrode; 124: control electrode; 128: side 130: diode device; 132: diode electrode; 140: auxiliary emitter wiring line; 150: control wiring line; 160: main wiring wire; 161: main wiring wire; 162: control wire; 164: auxiliary wire; 165: block-to-block wire; 166: block-to-block wire; 167: block-to-block wire; 170: connecting portion; 171: connecting portion; 172: connecting portion; 173: connecting portion; 180: straight line; 182: region; 190: circuit region; 191: connecting region; 192: trench gate; 200: circuit block; 210: circuit.

What is claimed is:

1. A semiconductor module, comprising:

a circuit board;

a first main wiring pattern provided on the circuit board;

a first main wiring line connecting portion, which is provided on the first main wiring pattern and to which a first main wiring line portion for applying a first power source voltage is connected;

a second main wiring pattern provided on the circuit board;

a second main wiring line connecting portion, which is provided on the second main wiring pattern and to which a second main wiring line portion for applying a second power source voltage is connected;

a main output wiring pattern provided on the circuit board;

a main output wiring line connecting portion, which is provided on the main output wiring pattern and to which a main output wiring line portion for outputting an output voltage is connected;

a first circuit, which is provided on the circuit board and electrically connected between the first main wiring line connecting portion and the main output wiring line connecting portion, and which includes a first transistor device and a first diode device connected inversely in parallel to each other;

a second circuit, which is provided on the circuit board and electrically connected between the main output wiring line connecting portion and the second main wiring line connecting portion, which includes a second transistor device and a second diode device connected inversely in parallel to each other, and which is arranged alongside each other with the first circuit in a first direction on the circuit board;

a first auxiliary emitter wiring line for prescribing an electric potential of the first main electrode;

a second auxiliary emitter wiring line for prescribing an electric potential of the second main electrode;

a first auxiliary wire for directly connecting the first auxiliary emitter wiring line to the first main electrode; and a second auxiliary wire for directly connecting the second auxiliary emitter wiring line to the second main electrode, wherein the circuit board includes a circuit region in which the first circuit and the second circuit are arranged alongside each other in the first direction, and a first connecting region and a second connecting region arranged sandwiching the circuit region in a second direction orthogonal to the first direction, the first main wiring line connecting portion and the second main wiring line connecting portion are provided in the first connecting region, the main output wiring line connecting portion is provided in the second connecting region, the first transistor device includes a first main electrode provided on an upper surface of the circuit board, and the second transistor device includes a second main electrode provided on the upper surface.

2. The semiconductor module according to claim 1, wherein the first auxiliary emitter wiring line and the second auxiliary emitter wiring line are arranged sandwiching the circuit region in the second direction.

3. The semiconductor module according to claim 2, comprising:

a plurality of first main wiring wires for connecting the first main electrode to the main output wiring pattern; and a plurality of second main wiring wires for connecting the second main electrode to the second main wiring pattern.

4. The semiconductor module according to claim 2, wherein:

the first transistor device includes a control electrode separately provided from the first main electrode on an upper surface;

the first main electrode has a first side and a second side facing each other as seen in a top view;

a connecting portion for the first main electrode of the first auxiliary wire is arranged closer to the first side than the second side; and the control electrode is arranged closer to the second side than the first side.

5. The semiconductor module according to claim 2, comprising:

a plurality of first circuits, each being identical to the first circuit; and a plurality of second circuits, each being identical to the second circuit, wherein the first circuits and the second circuits are alternately arranged along the first direction.

6. The semiconductor module according to claim 1, comprising:

a plurality of first main wiring wires for connecting the first main electrode to the main output wiring pattern; and a plurality of second main wiring wires for connecting the second main electrode to the second main wiring pattern.

7. The semiconductor module according to claim 6, wherein:

the first diode device includes a diode electrode provided on an upper surface; and the plurality of first main wiring wires includes a through-wire for connecting the first main electrode to the main output wiring pattern via the diode electrode, and a direct-wire for directly connecting the first main electrode to the main output wiring pattern without using the diode electrode.

8. The semiconductor module according to claim 7, wherein a wire connecting portion for the first main electrode of the first auxiliary wire is arranged between a wire connecting portion for the first main electrode of the direct-wire included in the plurality of first main wiring wires, and the first auxiliary emitter wiring line.

9. The semiconductor module according to claim 8, wherein:

the first transistor device includes a control electrode separately provided from the first main electrode on an upper surface;

the first main electrode has a first side and a second side facing each other as seen in a top view;

a connecting portion for the first main electrode of the first auxiliary wire is arranged closer to the first side than the second side; and the control electrode is arranged closer to the second side than the first side.

10. The semiconductor module according to claim 7, wherein:

a plurality of wire connecting portions for the first main electrode of the plurality of first main wiring wires is arranged alongside each other along the first direction; and a wire connecting portion for the first main electrode of the first auxiliary wire is arranged farther outward than the plurality of wire connecting portions of the plurality of first main wiring wires in the first direction.

11. The semiconductor module according to claim 7, wherein:

the first transistor device includes a control electrode separately provided from the first main electrode on an upper surface;

the first main electrode has a first side and a second side facing each other as seen in a top view;

a connecting portion for the first main electrode of the first auxiliary wire is arranged closer to the first side than the second side; and the control electrode is arranged closer to the second side than the first side.

12. The semiconductor module according to claim 6, wherein:

a plurality of wiring connecting portions for the first main electrode of the plurality of first main wiring wires is arranged alongside each other along the first direction; and a wire connecting portion for the first main electrode of the first auxiliary wire is arranged farther outward than the plurality of wire connecting portions of the plurality of first main wiring wires in the first direction.

13. The semiconductor module according to claim 12, wherein:

the first transistor device includes a control electrode separately provided from the first main electrode on an upper surface;

the first main electrode has a first side and a second side facing each other as seen in a top view;

a connecting portion for the first main electrode of the first auxiliary wire is arranged closer to the first side than the second side; and the control electrode is arranged closer to the second side than the first side.

14. The semiconductor module according to claim 6, wherein:

the first transistor device includes a control electrode separately provided from the first main electrode on an upper surface;

the first main electrode has a first side and a second side facing each other as seen in a top view;

a connecting portion for the first main electrode of the first auxiliary wire is arranged closer to the first side than the second side; and the control electrode is arranged closer to the second side than the first side.

15. The semiconductor module according to claim 1, wherein:

the first transistor device includes a control electrode separately provided from the first main electrode on an upper surface;

the first main electrode has a first side and a second side facing each other as seen in a top view;

a connecting portion for the first main electrode of the first auxiliary wire is arranged closer to the first side than the second side; and the control electrode is arranged closer to the second side than the first side.

16. The semiconductor module according to claim 1, wherein:

the first transistor device is arranged between the first diode device and the first auxiliary emitter wiring line in the second direction; and the second transistor device is arranged between the second diode device and the second auxiliary emitter wiring line in the second direction.

17. The semiconductor module according to claim 1, comprising:

a plurality of first circuits, each being identical to the first circuit; and a plurality of second circuits, each being identical to the second circuit, wherein the first circuits and the second circuits are alternately arranged along the first direction.

18. The semiconductor module according to claim 1, comprising:

a plurality of first circuits, each being identical to the first circuit; and a plurality of second circuits, each being identical to the second circuit, wherein the first circuits and the second circuits are alternately arranged along the first direction.

19. The semiconductor module according to claim 1, wherein:

the first transistor device and the first diode device are provided on the first main wiring pattern; and the second transistor device and the second diode device are provided on the main output wiring pattern.

20. A semiconductor module, comprising:

a circuit board;

a first main wiring pattern provided on the circuit board;

a first main wiring line connecting portion, which is provided on the first main wiring pattern and to which a first main wiring line portion for applying a first power source voltage is connected;

a second main wiring pattern provided on the circuit board;

a second main wiring line connecting portion, which is provided on the second main wiring pattern and to which a second main wiring line portion for applying a second power source voltage is connected;

a main output wiring pattern provided on the circuit board;

a main output wiring line connecting portion, which is provided on the main output wiring pattern and to which a main output wiring line portion for outputting an output voltage is connected;

a first circuit, which is provided on the circuit board and electrically connected between the first main wiring line connecting portion and the main output wiring line connecting portion, and which includes a first transistor device and a first diode device connected inversely in parallel to each other; and a second circuit, which is provided on the circuit board and electrically connected between the main output wiring line connecting portion and the second main wiring line connecting portion, which includes a second transistor device and a second diode device connected inversely in parallel to each other, and which is arranged alongside each other with the first circuit in a first direction on the circuit board, wherein the circuit board includes a circuit region in which the first circuit and the second circuit are arranged alongside each other in the first direction, and a first connecting region and a second connecting region arranged sandwiching the circuit region in a second direction orthogonal to the first direction, the first main wiring line connecting portion and the second main wiring line connecting portion are provided in the first connecting region, the main output wiring line connecting portion is provided in the second connecting region, and the first main wiring line connecting portion overlaps the second main wiring line connecting portion in the first direction.

21. The semiconductor module according to claim 20, wherein the first main wiring pattern is a first lead frame wiring pattern, the second main wiring pattern is a second lead frame wiring pattern, the main output wiring pattern is a main lead frame wiring pattern, each of the first transistor device, the first diode device, the second transistor device, and the second diode device doesn't overlap each of the first connecting region and the second connection region.

22. The semiconductor module according to claim 21, comprising:

a plurality of first circuits, each being identical to the first circuit; and a plurality of second circuits, each being identical to the second circuit, wherein the first circuits and the second circuits are alternately arranged along the first direction.

23. The semiconductor module according to claim 21, wherein:

the first transistor device and the first diode device are provided on the first main wiring pattern; and the second transistor device and the second diode device are provided on the main output wiring pattern.

* * * * *